(12) United States Patent
Kettler et al.

(10) Patent No.: US 10,481,355 B2
(45) Date of Patent: Nov. 19, 2019

(54) OPTICAL ASSEMBLY

(71) Applicant: Sicoya GmbH, Berlin (DE)

(72) Inventors: Thorsten Kettler, Berlin (DE); Moritz Grehn, Berlin (DE); Christoph Theiss, Berlin (DE); Stefan Meister, Berlin (DE)

(73) Assignee: Sicoya GmbH, Berlin (DE)

( * ) Notice: Subject to any disclaimer, the term of this patent is extended or adjusted under 35 U.S.C. 154(b) by 75 days.

(21) Appl. No.: 15/958,883

(22) Filed: Apr. 20, 2018

(65) Prior Publication Data

US 2019/0324222 A1 Oct. 24, 2019

(51) Int. Cl.
*G02B 6/43* (2006.01)
*G02B 6/42* (2006.01)
*H04B 10/80* (2013.01)
*H04B 10/50* (2013.01)
*G02B 6/32* (2006.01)

(52) U.S. Cl.
CPC ............ *G02B 6/43* (2013.01); *G02B 6/4206* (2013.01); *G02B 6/4207* (2013.01); *G02B 6/4214* (2013.01); *H04B 10/503* (2013.01); *H04B 10/801* (2013.01); *G02B 6/32* (2013.01)

(58) Field of Classification Search
CPC .......... G02B 6/43; G02B 6/32; G02B 6/4204; G02B 6/4206; G02B 6/4207; G02B 6/4214; G02B 6/4251; H04B 10/503; H04B 10/801

USPC ................................................ 385/14, 88–92
See application file for complete search history.

(56) References Cited

U.S. PATENT DOCUMENTS

| | | | |
|---|---|---|---|
| 6,969,204 B2 | 11/2005 | Kilian | |
| 7,298,941 B2 | 11/2007 | Palen et al. | |
| 8,168,939 B2 | 5/2012 | Mack et al. | |
| 10,162,135 B2* | 12/2018 | Gamache | G02B 6/4251 |
| 2004/0190836 A1* | 9/2004 | Kilian | G02B 6/4206 385/92 |
| 2005/0062056 A1 | 3/2005 | Baugh et al. | |
| 2016/0011375 A1 | 1/2016 | Anderson et al. | |

* cited by examiner

*Primary Examiner* — Michael P Mooney
(74) *Attorney, Agent, or Firm* — Gordon Rees Scully Mansukhani, LLP

(57) ABSTRACT

An embodiment of the invention relates to an optical assembly comprising an optical emitter configured to generate a beam of optical radiation, a cap unit holding the optical emitter, a photonic chip comprising a coupler, and an intermediate chip arranged between the cap unit and the photonic chip, wherein the cap unit comprises a recess having a bottom section and a sidewall, wherein the optical emitter is mounted on the bottom section of the recess, wherein a section of the sidewall forms a mirror section angled with respect to the bottom section and configured to reflect said beam of optical radiation towards the coupler, and wherein the intermediate chip comprises a lens formed at a lens section of the intermediate chip's surface that faces the cap unit, said lens being configured to focus the reflected optical beam towards the coupler.

43 Claims, 20 Drawing Sheets

OPTICAL ASSEMBLY

The invention relates to optical assemblies and methods of fabricating optical assemblies.

BACKGROUND OF THE INVENTION

An optical assembly is disclosed for instance in U.S. Pat. No. 8,168,939 B2. The optical assembly supports direct coupling to a photonically enabled complementary metal-oxide semiconductor (CMOS) chip. The assembly includes a laser, a microlens, a turning mirror, reciprocal and/or non-reciprocal polarization rotators, and an optical bench.

OBJECTIVE OF THE PRESENT INVENTION

An objective of the present invention is to provide an optical assembly that can be reliably manufactured. More specifically, an objective is to achieve small tolerances regarding the optical adjustment of a beam path between components of the optical assembly.

A further objective of the present invention is to provide a method of fabricating optical assemblies that have small tolerances regarding the optical adjustment between components of the optical assembly.

BRIEF SUMMARY OF THE INVENTION

An embodiment of the present invention relates to an optical assembly comprising an optical emitter configured to generate a beam of optical radiation, a cap unit holding the optical emitter, a photonic chip comprising a coupler, and an intermediate chip arranged between the cap unit and the photonic chip, wherein the cap unit comprises a recess having a bottom section and a sidewall, wherein the optical emitter is mounted on the bottom section of the recess, wherein a section of the sidewall forms a mirror section angled with respect to the bottom section and configured to reflect said beam of optical radiation towards the coupler, and wherein the intermediate chip comprises a lens formed at a lens section of the intermediate chip's surface that faces the cap unit, said lens being configured to focus the reflected optical beam towards the coupler.

The optical emitter is preferably an edge-emitting laser.

The lens may comprise a first axis and a second axis that is perpendicular to the first axis.

The radius of the curvature of the lens along the first axis preferably differs from the radius of the curvature along the second axis.

The emission direction of the optical emitter preferably corresponds to the direction of the first axis.

The radius of the curvature along the first axis is preferably between 2% and 15% larger than the radius along the second axis.

According to a preferred embodiment, an interposer chip is arranged between the intermediate chip and the photonic chip.

The interposer chip may have a front surface that faces the intermediate chip and a backside surface that faces the photonic chip. The backside surface preferably comprises a hole that is located in the beam path between the lens and the coupler.

The hole may be a through-hole that extends from the front surface to the backside surface of the interposer chip.

A rotator is preferably arranged within said hole.

Alternatively or additionally, a $\lambda/2$-waveplate—with respect to the wavelength of the optical radiation—may be arranged within said hole.

Alternatively or additionally, a polarizer may be arranged within said hole.

The interposer chip and the intermediate chip are preferably bonded together by a buried oxide layer.

The hole preferably extends from the backside surface of the interposer chip through the interposer chip and through the buried oxide layer to the intermediate chip.

The interposer chip, the intermediate chip and the buried oxide layer may be formed by or comprised by an SOI-chip.

Further, the cap unit preferably comprises an SOI-Chip having a silicon top layer, a buried oxide layer, and a bottom layer.

The recess preferably extends from the outer surface of the silicon top layer to the buried oxide layer or through the buried oxide layer to the bottom layer. The bottom of the recess is preferably formed by a section of the buried oxide layer or a section of the bottom layer.

The cap unit preferably comprises a semiconductor substrate having a front side in which the recess is formed. The surface of the intermediate chip, in which said lens is formed, preferably comprises at least one bonding section on which the front side of the cap unit is bonded.

The semiconductor substrate (of the cap unit) is preferably a (110)-oriented substrate with the front side being formed by a (110) surface.

The mirror section is preferably a (111) surface.

According to a further preferred embodiment, a first electrical contact of the optical emitter is connected to a conductive layer of the cap unit.

The conductive layer of the cap unit preferably extends from the bottom section of the recess to a first bonding section of the cap unit.

The first bonding section of the cap unit is preferably located outside the recess and bonded to a first bonding section of the intermediate chip.

A second electrical contact of the optical emitter is preferably directly bonded on a second bonding section of the intermediate chip.

The conductive layer of the cap unit is preferably thicker in the contact area where the optical emitter is located than outside this contact area.

The conductive layer of the cap unit preferably consists of two or more sublayers in the contact area.

Alternatively or additionally, a conductive pad may be located between the optical emitter and the conductive layer.

The conductive layer preferably forms a reflection coating on the mirror section.

The conductive layer preferably forms an electrical connection section between the bottom section of the recess and the first bonding section of the cap unit.

The intermediate chip preferably comprises a first conductive layer, a second conductive layer and an isolation layer.

The isolation layer is preferably arranged between the first and second conductive layer and insulates the first and second conductive layer from one another.

The isolation layer of the intermediate chip preferably forms an antireflection layer for the lens.

A heat spreader is preferably mounted on a backside of the cap unit, the backside being opposed to the front side where the recess is formed.

A further embodiment of the invention relates to a method of fabricating an optical assembly comprising the steps of fabricating a cap unit and mounting an optical emitter thereon, the optical emitter being configured to generate a beam of optical radiation, wherein said step of forming the cap unit comprises etching a recess having a bottom section and a sidewall, and mounting the optical emitter on the bottom section of the recess, forming a photonic chip comprising a coupler, forming an intermediate chip comprising a lens and arranging the intermediate chip between the cap unit and the photonic chip, wherein a section of the sidewall forms a mirror section that is angled with respect to the bottom section and configured to reflect said beam of optical radiation towards the coupler, and wherein the lens is formed at a lens section of the intermediate chip's surface that faces the cap unit, said lens being configured to focus the reflected optical beam towards the coupler.

Said step of fabricating the cap unit preferably further comprises depositing a conductive layer, wherein the conductive layer extends from the bottom section of the recess to a first bonding section of the cap unit located outside of the recess and forms an electric connection section, and wherein the conductive layer further forms a reflection coating on the mirror section.

The thickness of the conductive layer is preferably made thicker in the contact area where the optical emitter is located than outside this contact area.

Said step of fabricating the cap unit may further comprise depositing solder on the bottom section of the recess before mounting the optical emitter on the bottom section of the recess.

Said step of fabricating the cap unit may further comprise providing a solder stop between the bottom section of the recess and the mirror section.

Said step of fabricating the cap unit may further comprise providing a solder stop that completely surrounds the mirror section.

The recess is preferably deeper than the thickness of the optical emitter.

The cap unit preferably comprises an SOI-Chip having a (110)-silicon top layer, a buried oxide layer, and a bottom layer.

The recess is preferably anisotropically etched from the outer surface of the silicon top layer to the buried oxide layer or through the buried oxide layer to the bottom layer.

The bottom of the recess is preferably formed by a section of the buried oxide layer or a section of the bottom layer.

The mirror section is preferably provided by a (111)-surface of the etched recess.

The step of forming the intermediate chip preferably comprises etching the lens at one side of the intermediate chip.

The step of forming the intermediate chip may comprise depositing an antireflection coating on the other side of the intermediate chip.

The step of forming the intermediate chip preferably comprises depositing an antireflection coating on the lens.

Said step of fabricating the intermediate chip preferably comprises depositing a first conductive layer, an isolation layer and a second conductive layer wherein the isolation layer is arranged between the first and second conductive layer and insulates the first and second conductive layer from one another.

The isolation layer of the intermediate chip preferably forms an antireflection layer on the lens.

The recess or at least the mirror section are preferably etched using KOH or TMAH.

Further, the method may comprise the step of fabricating an interposer chip and arranging the interposer chip between the intermediate chip and the photonic chip.

According to a preferred embodiment, the method may further comprise the steps of etching a hole in the backside surface of the interposer chip and positioning the hole in the beam path between the lens and the coupler.

Said step of etching the hole may comprise etching a through-hole extending from the front surface to the backside surface of the interposer chip.

Said step of etching the recess may include etching alignment marks that facilitate mounting the silicon cap in a predefined position onto the intermediate chip.

According to a further preferred embodiment, the interposer chip may comprise SOI material having a silicon substrate, a buried oxide layer and a top silicon layer. Said step of etching the hole may comprise etching a blind hole extending from the backside surface to the buried oxide layer.

According to a further preferred embodiment, the method may comprise the steps of etching a hole in an interposer chip, and bonding the interposer chip and the intermediate chip.

The lens may be formed in the intermediate chip after or before bonding the interposer chip and intermediate chip.

According to a further preferred embodiment, the method may comprise the steps of bonding an interposer chip and the intermediate chip via an intermediate oxide layer and forming a sandwich, etching a through-hole in the interposer chip using the intermediate oxide layer as an etch-stop-layer, and removing the etch-stop-layer in the hole and forming a pot-hole, the bottom of which is formed by the intermediate chip.

The intermediate chip and the interposer chip may each have a thickness of about 500 μm.

The depth of the recess may be about 120 μm.

The angle at which the beam falls onto the coupler is preferably about 19.5°.

The above recited method steps may be carried out on a chip scale or wafer scale. In the latter case, a plurality of chips are processed simultaneously and separated from one another at a later stage of the entire manufacturing process.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings. It will be readily understood that the present invention, as generally described and illustrated in the figures herein, could vary in a wide range. Thus, the following more detailed description of the exemplary embodiments of the present invention, as represented in the figures, is not intended to limit the scope of the invention, as claimed, but is merely representative of presently preferred embodiments of the invention.

Figure 1:
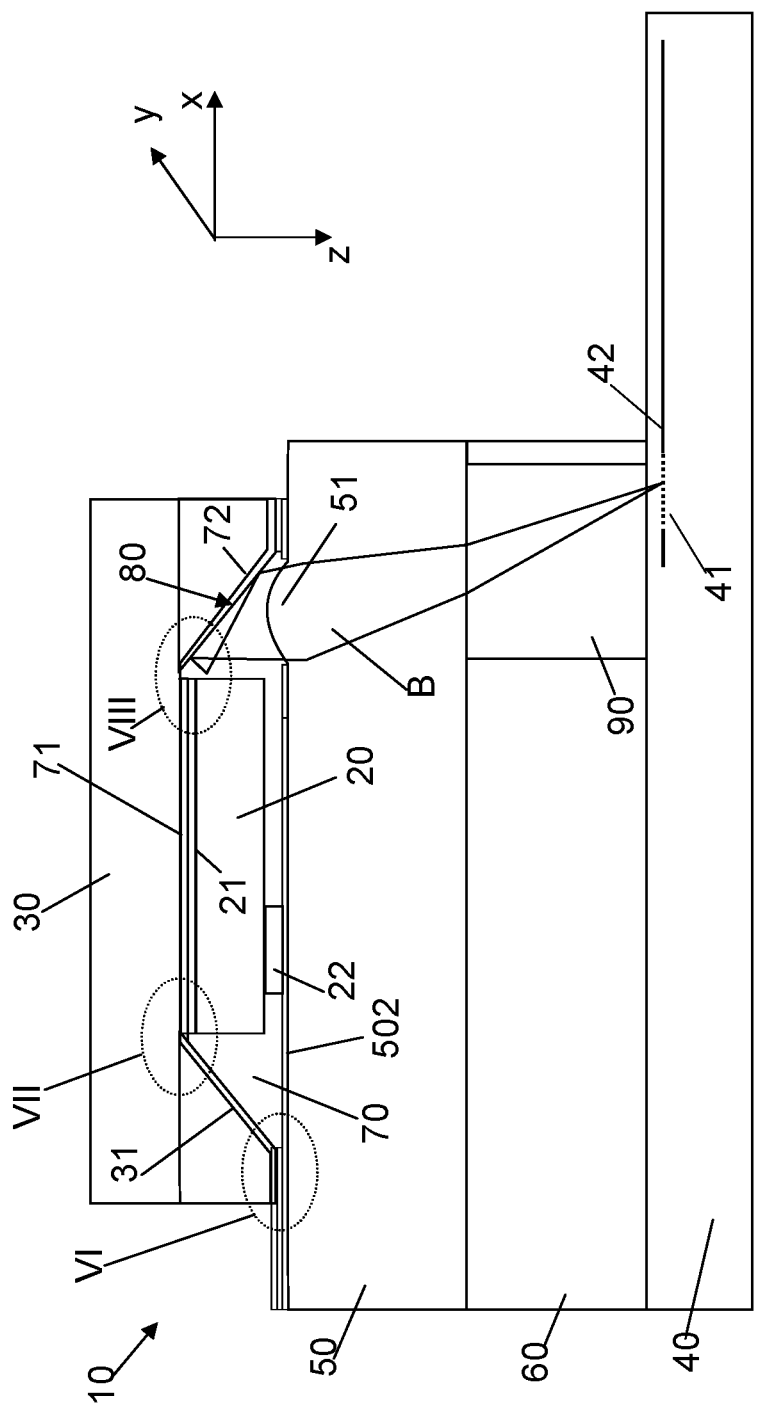
FIG. 1-5,12,22 illustrate exemplary embodiments of optical assemblies according to the present invention.

FIG. 1 shows a first exemplary embodiment of an optical assembly 10 according to the present invention. The optical assembly 10 comprises an optical emitter 20 capable of generating a beam B of optical radiation. The beam B is oriented parallel to the space coordinate x in FIG. 1 when it leaves the optical emitter 20. A cap unit 30 carries the optical emitter 20.

The optical assembly 10 further comprises a photonic chip 40, an intermediate chip 50 and an interposer chip 60. The intermediate chip 50 is arranged between the cap unit 30 and the photonic chip 40. The interposer chip 60 is arranged between the intermediate chip 50 and the photonic chip 40.

The cap unit 30 comprises a recess 70 with a bottom section 71 and a sidewall 72. The optical emitter 20 is mounted on the bottom section 71 of the recess 70. A section of the sidewall 72 forms a mirror section 80 that is angled with respect to the bottom section 71 and configured to reflect the beam B of optical radiation towards a coupler 41 of the photonic chip 40. The coupler is connected to a waveguide 42 that extends in the space coordinate x in FIG. 1 and therefore in the same direction as the beam B before the beam B is reflected by the mirror section 80.

The cap unit 30 preferably comprises a (110)-oriented semiconductor substrate in which the recess 70 is preferably etched. If the recess 70 is fabricated by anisotropic etching, the mirror section 80 is formed by a (111)-oriented surface. In a (110)-oriented semiconductor substrate, the (111)-oriented mirror section 80 has an angle of 54.75° with respect to the space coordinate z in FIG. 1 and an angle of 35.25° with respect to the space coordinate x in FIG. 1.

In order to improve the coupling efficiency between the mirror section 80 and the coupler 41, the intermediate chip 50 may comprise a lens 51. The lens 51 is formed at a lens section of the intermediate chip's surface that faces the cap unit 30. The lens 51 is configured to focus the reflected optical beam B towards the coupler 41.

The interposer chip 60 has a front surface that faces the intermediate chip 50 and a backside surface that faces the photonic chip 40. In the backside surface, a hole 90 has been fabricated. The hole 90 is situated in the beam path between the lens 51 and the coupler 41.

The hole 90 may be a through-hole that extends from the front surface to the backside surface of the interposer chip 60. The hole 90 may be empty as shown in FIG. 1.

The front side of the cap unit 30 may be bonded on the outer surface of the intermediate chip 50, i.e. the surface where the lens 51 is formed. The bonding section is marked by reference numeral VI in FIG. 1 and will be explained in further detail with reference to FIG. 6.

FIG. 1 further shows that a first electrical contact 21 of the optical emitter 20 is connected to a conductive layer 31 of the cap unit 30. The conductive layer 31 extends from the bottom section 71 of the recess 70 to the bonding section VI. A portion of the first electrical contact 21 and the conductive layer 31 is marked by reference numeral VII in FIG. 1 and will be explained in further detail with reference to FIG. 7.

FIG. 1 further shows that the conductive layer 31 of the cap unit 30 may cover the sidewall 72 and form the mirror section 80. A portion of the conductive layer 31 is marked by reference numeral VIII in FIG. 1 and will be explained in further detail with reference to FIG. 8.

An advantage of the embodiment of FIG. 1 is that the vertical sandwich structure in combination with the integrated lens provides a high coupling efficiency at low manufacturing costs.

Figure 2:
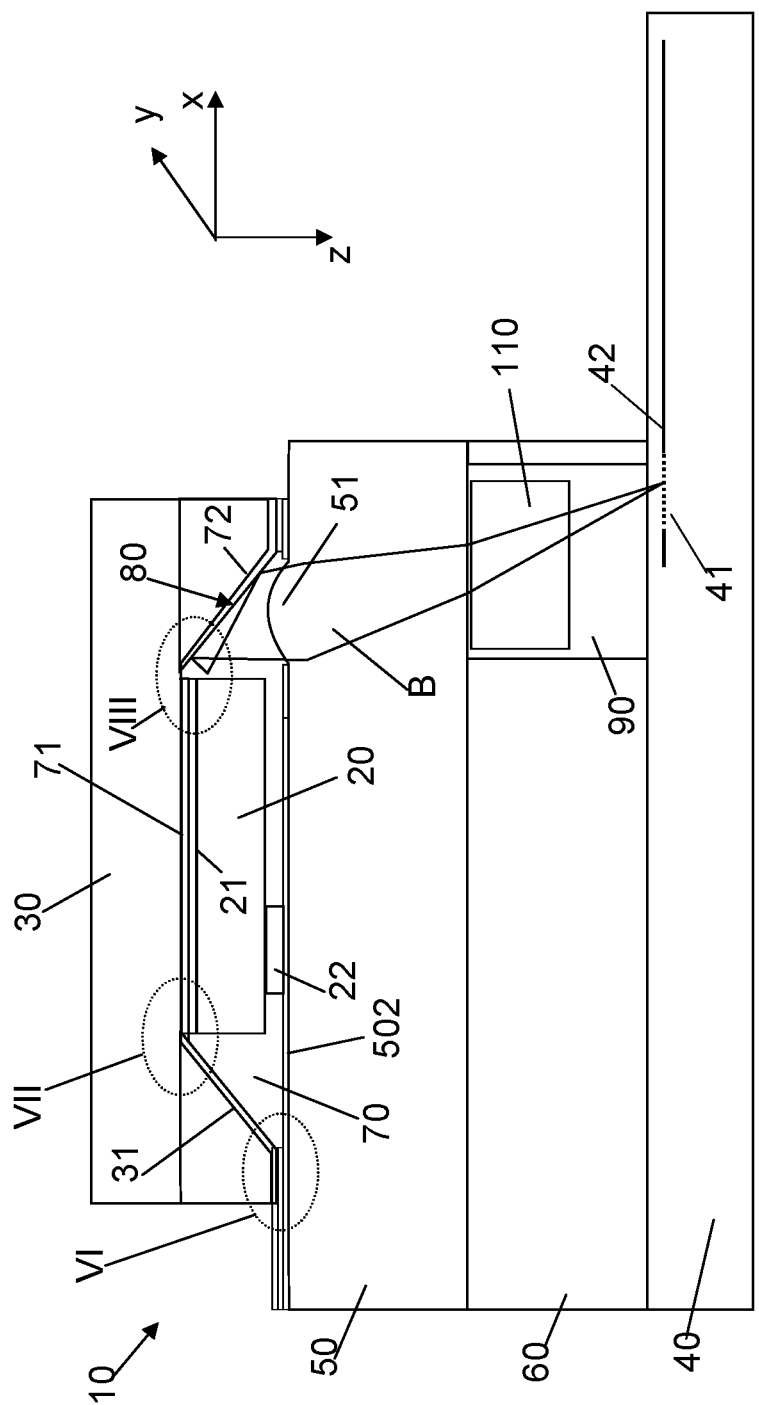

FIG. 2 shows a second exemplary embodiment of an optical assembly 10 according to the present invention. In this embodiment, a rotator 110 is arranged within the hole 90 of the interposer chip 60. The rotator 110 preferably rotates the polarization of the optical radiation by 45° and may reduce the feedback of radiation into the optical emitter 20.

Figure 3:
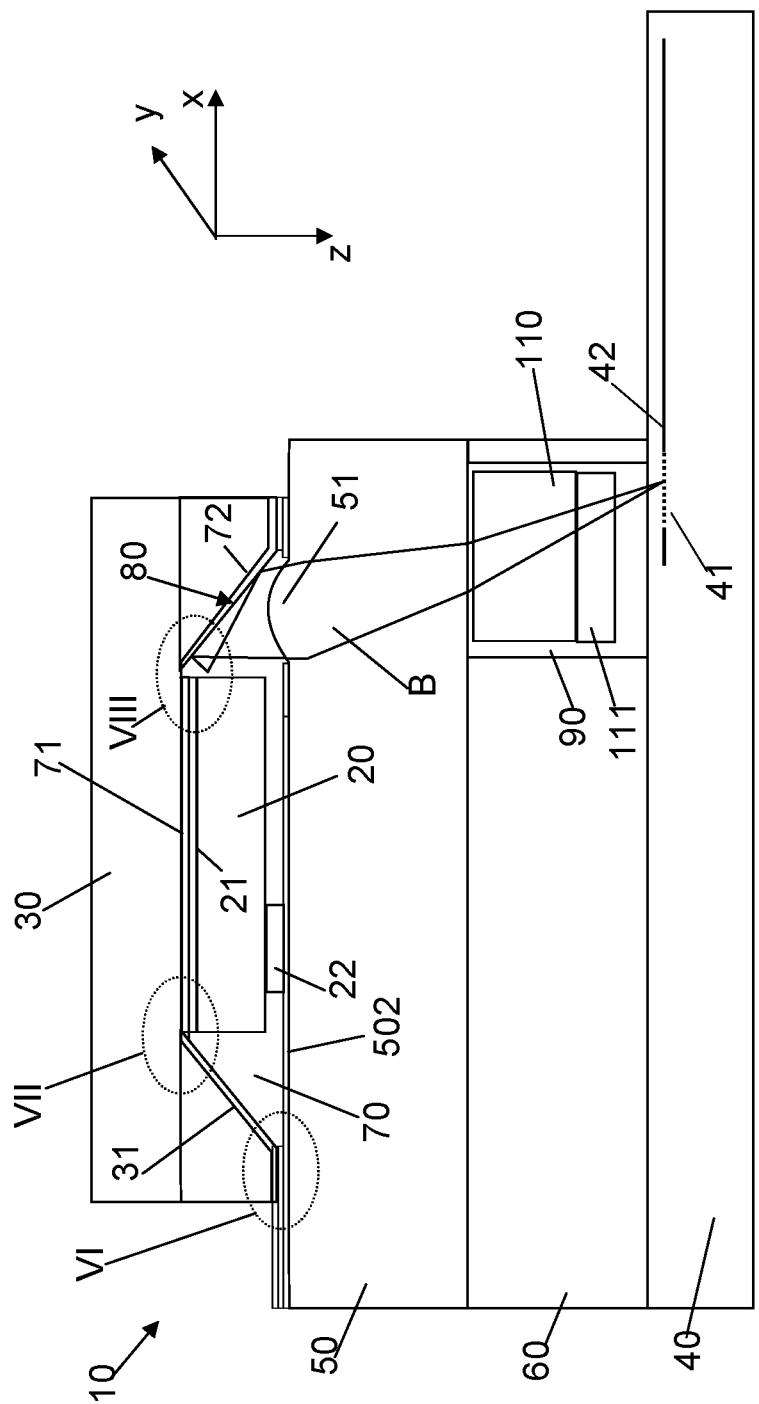

FIG. 3 shows a third exemplary embodiment of an optical assembly 10 according to the present invention. In this embodiment, a rotator 110 and a λ/2 waveplate 111 are arranged within the hole 90 of the interposer chip 60. The rotator 110 preferably rotates the polarization of the optical radiation by 45°. The rotator 110 and the λ/2 waveplate 111 may reduce the feedback of radiation into the optical emitter 20.

Figure 4:
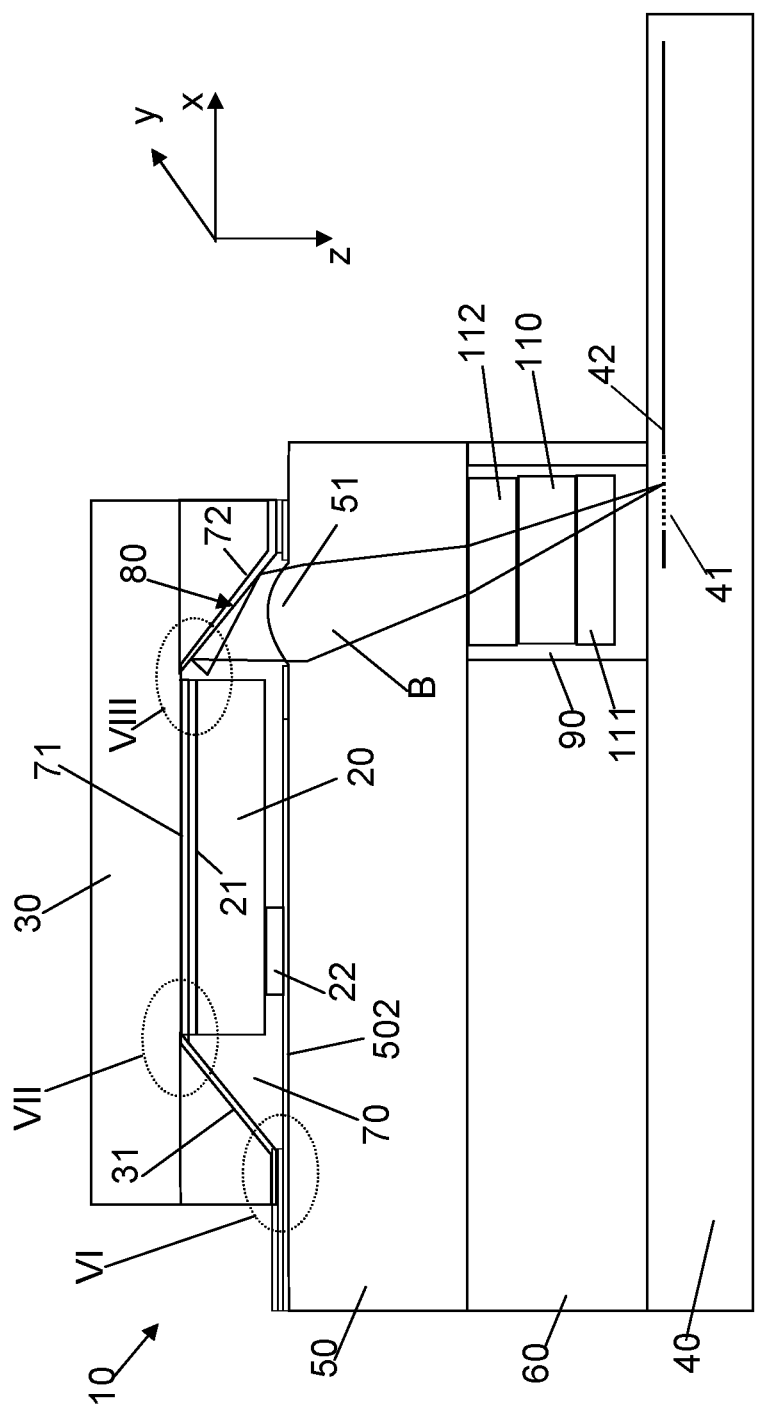

FIG. 4 shows a fourth exemplary embodiment of an optical assembly 10 according to the present invention. In this embodiment, a rotator 110, a polarizer 112 and a λ/2 waveplate 111 are arranged within the hole 90 of the interposer chip 60. The rotator 110 preferably rotates the polarization of the optical radiation by 45°. The rotator 110, the polarizer 112 and the λ/2 waveplate 111 may reduce the feedback of radiation into the optical emitter 20.

Figure 23:
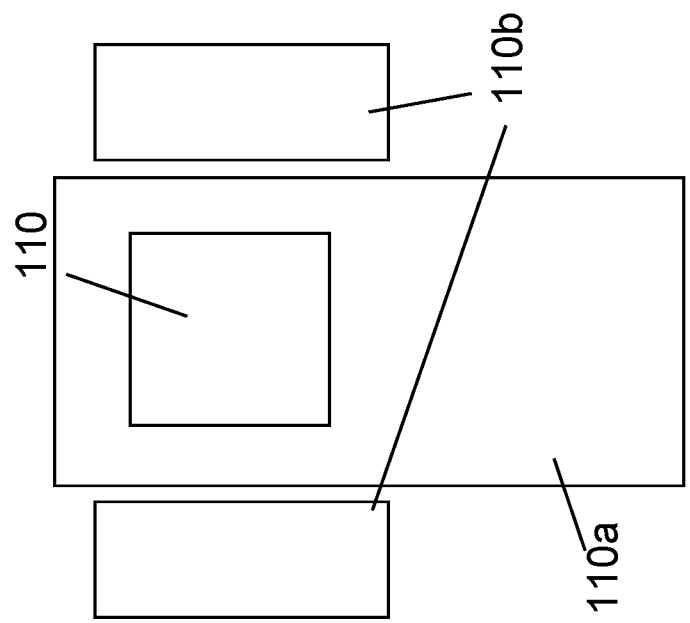

In the embodiments of FIGS. 2, 3 and 4, the rotator 110 can either be self-magnetized or externally magnetized. As shown in FIG. 23, the rotator 110 may be located inside a micro-package 110a and one or more external magnets 110b may be placed outside of the micro-package 110a. In the latter case preferably two external magnets 110b are preferably glued onto the outer sidewalls of the micro-package 110a opposite to each other.

Figure 5:
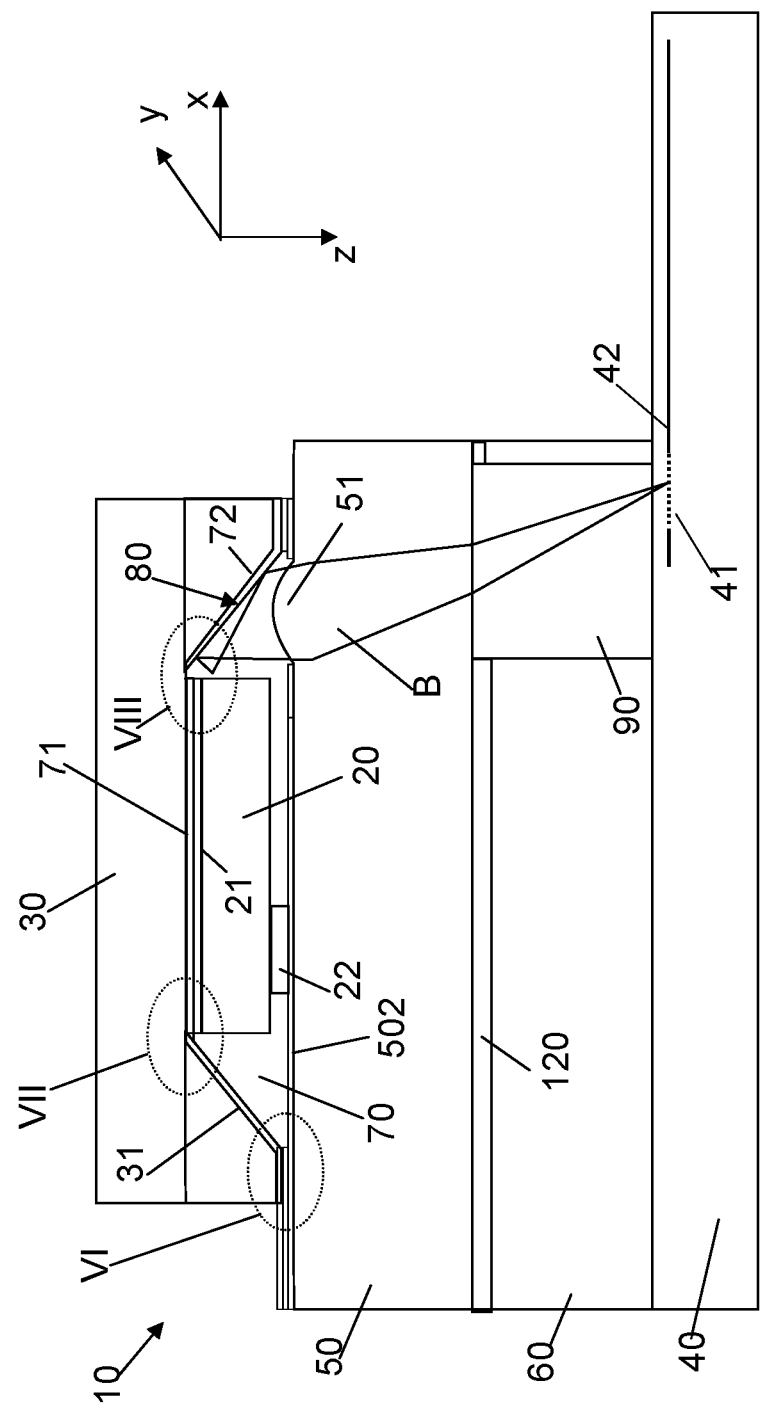

FIG. 5 shows a further exemplary embodiment of an optical assembly 10 according to the present invention. In this embodiment, the intermediate chip 50 and the interposer chip 60 are bonded together by an intermediate oxide layer 120. The interposer chip 60, the intermediate chip 50 and the intermediate oxide layer 120 can therefore be formed by a single pre-processed SOI-chip (sandwich). The hole 90 may be a blind hole that is etched into the pre-processed SOI-chip.

The hole 90 may extend from the backside surface of the interposer chip 60 through the interposer chip 60 and through the intermediate oxide layer 120 to the intermediate chip 50. The hole 90 may be at least partly filled with a rotator 110 as shown in FIG. 2, a rotator 110 and a λ/2 waveplate 111 as shown in FIG. 3, or a rotator 110, a polarizer 112 and a λ/2 waveplate 111 as shown in FIG. 4.

Figure 6:
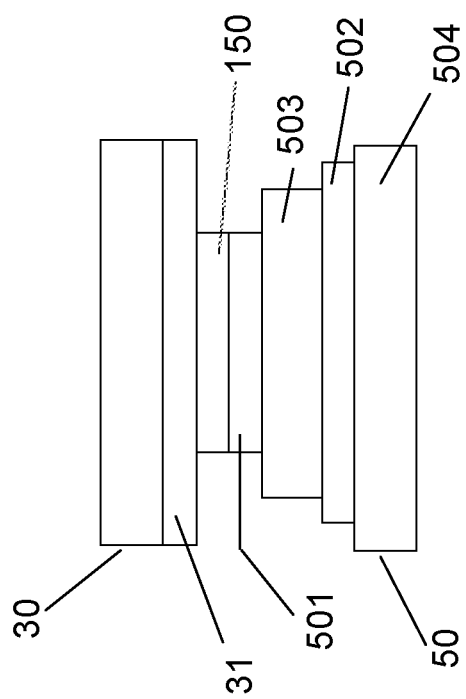
FIG. 6-8 illustrate portions of the exemplary embodiments of FIGS. 1-5 and 12, FIG. 9-11 illustrate an exemplary embodiment of a lens.

FIG. 6 shows the bonding section VI of FIG. 1 in further detail. In the embodiment of FIG. 6, the intermediate chip 50 comprises a first conductive layer 501, a second conductive layer 502, an isolation layer 503 and a silicon substrate 504. The isolation layer 503 is arranged between the first and second conductive layer 501, 502 and insulates the first and second conductive layer 501, 502 from one another. The isolation layer 503 of the intermediate chip 50 may form an antireflection layer on top of the lens 51.

The first conductive layer 501 is bonded with the conductive layer 31 of the cap unit 30 via solder 150 and therefore electrically connected with the first electrical contact 21 of the optical emitter 20.

The second conductive layer 502 may be electrically connected with a second electrical contact 22 of the optical emitter 20 (see FIG. 1).

Figure 7:
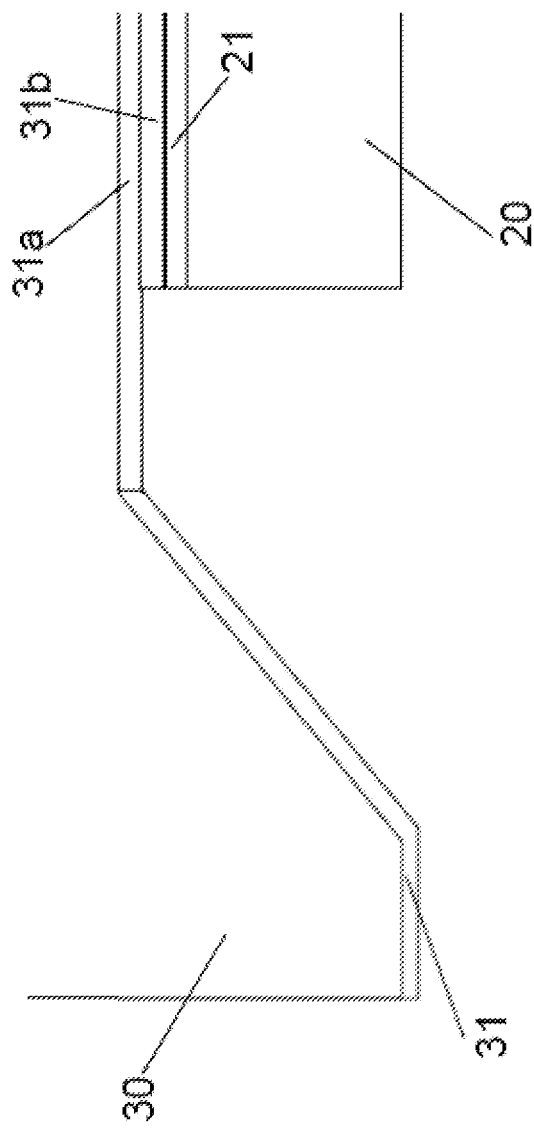

FIG. 7 shows the section VII of FIG. 1 in further detail. The conductive layer 31 is connected to the first electrical contact 21 of the optical emitter 20.

In order to provide a platform for the optical emitter 20, the conductive layer 31 of the cap unit 30 may be thicker in the contact area where the optical emitter 20 is located than outside this contact area. To this end, the conductive layer 31 of the cap unit 30 may consist of two or more sublayers 31a, 31b in the contact area as shown. Additionally or alternatively, a conductive pad may located between the optical emitter 20 and the conductive layer 31.

Figure 8:
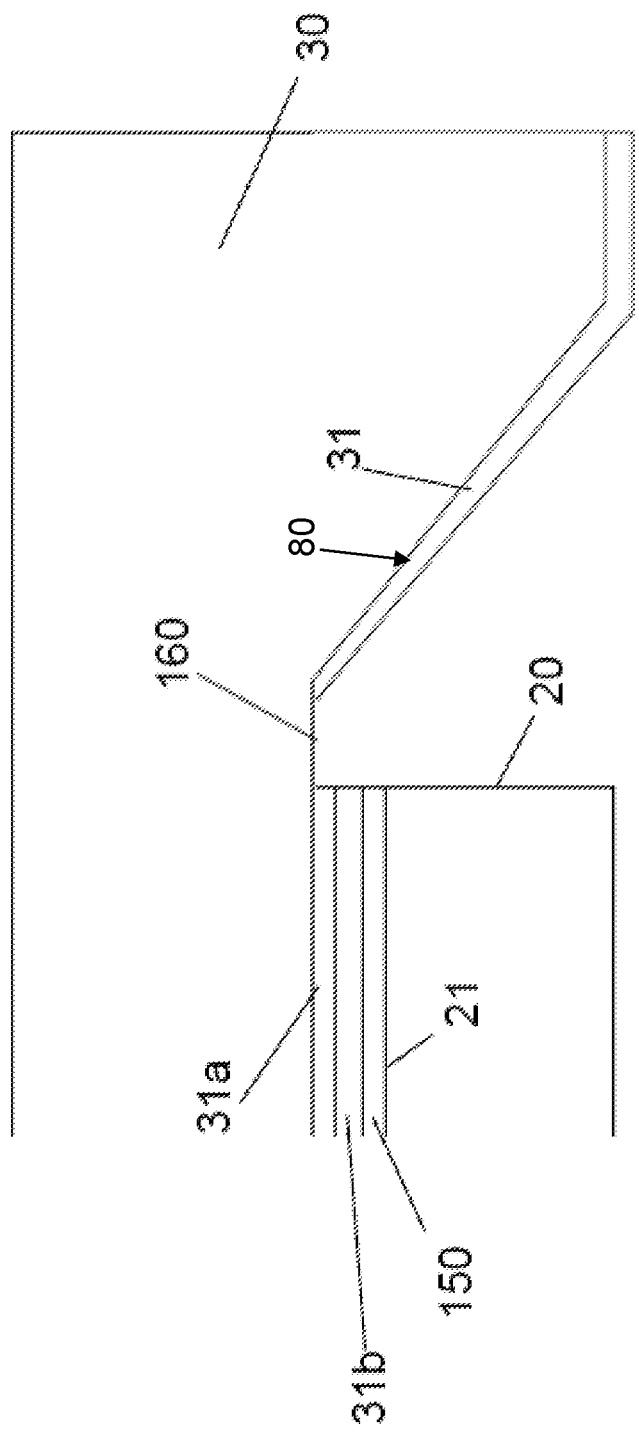

FIG. 8 shows the portion VIII of FIG. 1 in further detail. A solder-stop during the fabrication avoids that solder 150 fills the gap 160 between the mirror section 80 and the first electrical contact 21 of the optical emitter 20. The conductive layer 31 forms a reflection coating on the mirror section 80.

Figure 9:
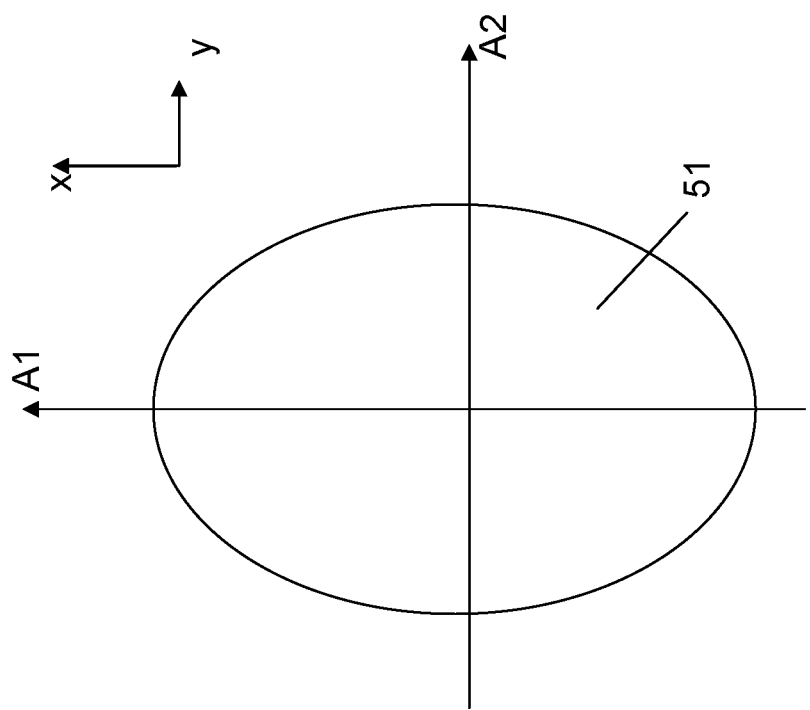
Figure 10:
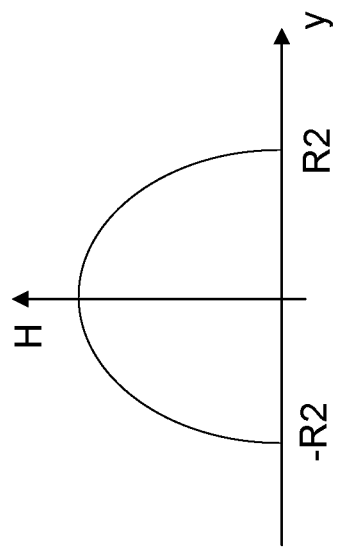
Figure 11:
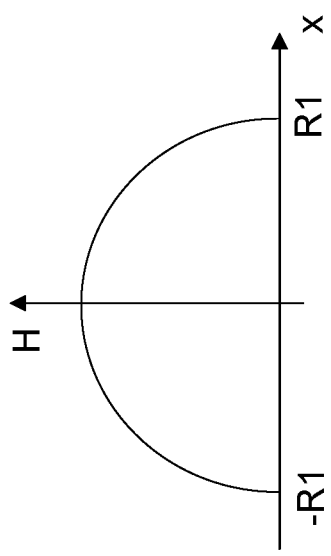

An exemplary embodiment of the lens 51 of FIG. 1 is depicted in further detail in FIGS. 9, 10 and 11.

FIG. 9 shows a top view of the lens 51. The lens 51 comprises a first axis A1 parallel to the space coordinate x and a second axis A2 that is perpendicular to the first axis A1 and parallel to the space coordinate y. The direction of the first axis corresponds to the emission direction of the optical emitter 20.

In FIGS. 10 and 11, the height H of the lens 51 is depicted over the space coordinates x and y, respectively. The radius R1 of the curvature of the lens 51 along the first axis A1 differs from the radius R2 of the curvature along the second axis A2. Preferably, the radius R1 of the curvature along the first axis A1 is between 5% and 15% larger than the radius R2 along the second axis A2.

The following parameters are considered advantageous:

$$250\ \mu m \leq R2 \leq 310\ \mu m$$

$$250\ \mu m \leq R1 \leq 330\ \mu m$$

$$1.02 \leq A1/A2 \leq 1.15$$

Figure 12:
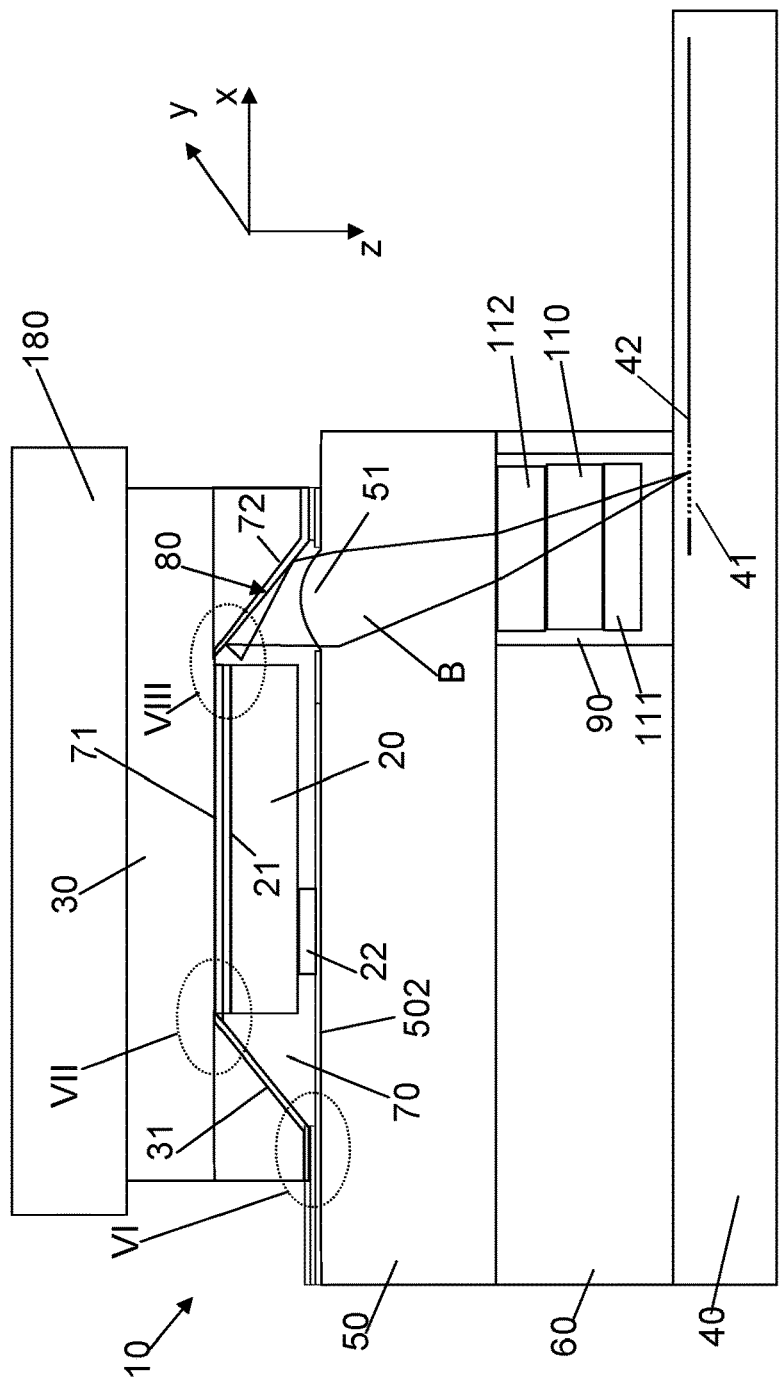

FIG. 12 shows a further exemplary embodiment of an optical assembly 10 according to the present invention. In this embodiment, a heat spreader 180 is mounted on a backside of the cap unit 30. The backside is located opposite to the front side where the recess 70 is formed.

Figure 13:
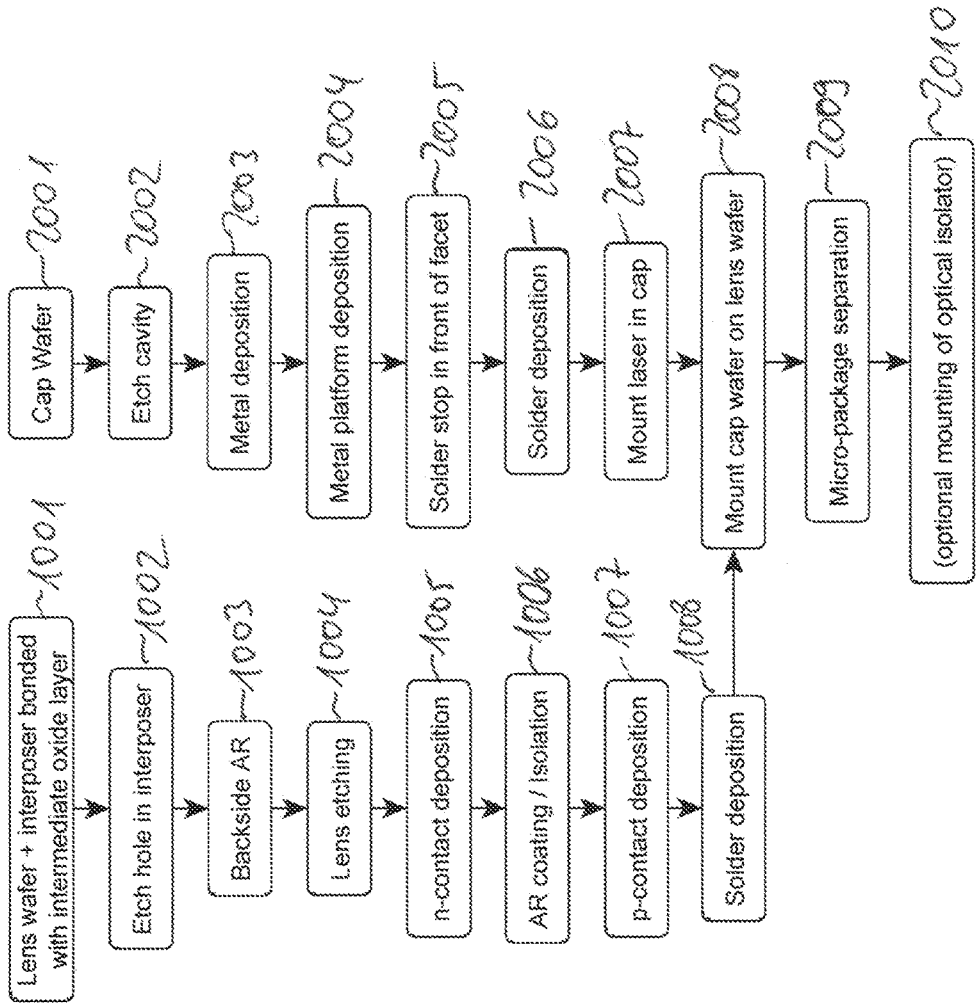
FIG. 13-16 illustrate exemplary embodiments of method steps according to the present invention, FIG. 17-21 exemplary embodiments of recesses and markers in a cap unit of optical assemblies, and FIG. 23 an exemplary embodiment of an externally magnetized rotator.

FIG. 13 shows an exemplary embodiment of a process flow that allows fabricating parts of the optical assembly 10. The method according to FIG. 13 refers to a wafer scale process where an intermediate wafer (also referred to as lens wafer) and an interposer wafer are bonded before etching holes 90. The method according to FIG. 13 comprises the steps of:

bonding an intermediate wafer (for the future intermediate chips 50) and an interposer wafer (for the future interposer chips 60) by an intermediate oxide layer 120 (step 1001), etching holes 90 into the intermediate wafer (step 1002), providing an antireflection coating on the backside of the intermediate wafer (step 1003), etching lenses 51 on the outside surface of the intermediate wafer (step 1004), depositing the second conductive layer 502 (for the n-contacts of the optical emitters 20) on the outside surface of the intermediate wafer (step 1005), depositing the isolation layer 503 on top of the second conductive layer 502 (step 1006), depositing the first conductive layer 501 (for the p-contacts of the optical emitters 20) on top of the isolation layer 503 (step 1007), depositing solder 150 on top of the first conductive layer 501 (step 1008), masking a cap wafer (step 2001), etching recesses 70 into the cap wafer (step 2002), depositing a conductive layer 31 (step 2003), providing platforms for the optical emitters 20 (step 2004), depositing solder-stops adjacent to mirror sections 80 (step 2005), depositing solder 150 (step 2006), mounting optical emitters 20 (e.g. a lasers) in the recesses 70 and forming cap units 30 that carry the optical emitters 20 (step 2007), mounting the cap wafer on the intermediate wafer (step 2008), separating the resulting composite for micro-packages (step 2009), optionally mounting rotators 110 (step 2010).

Figure 14:
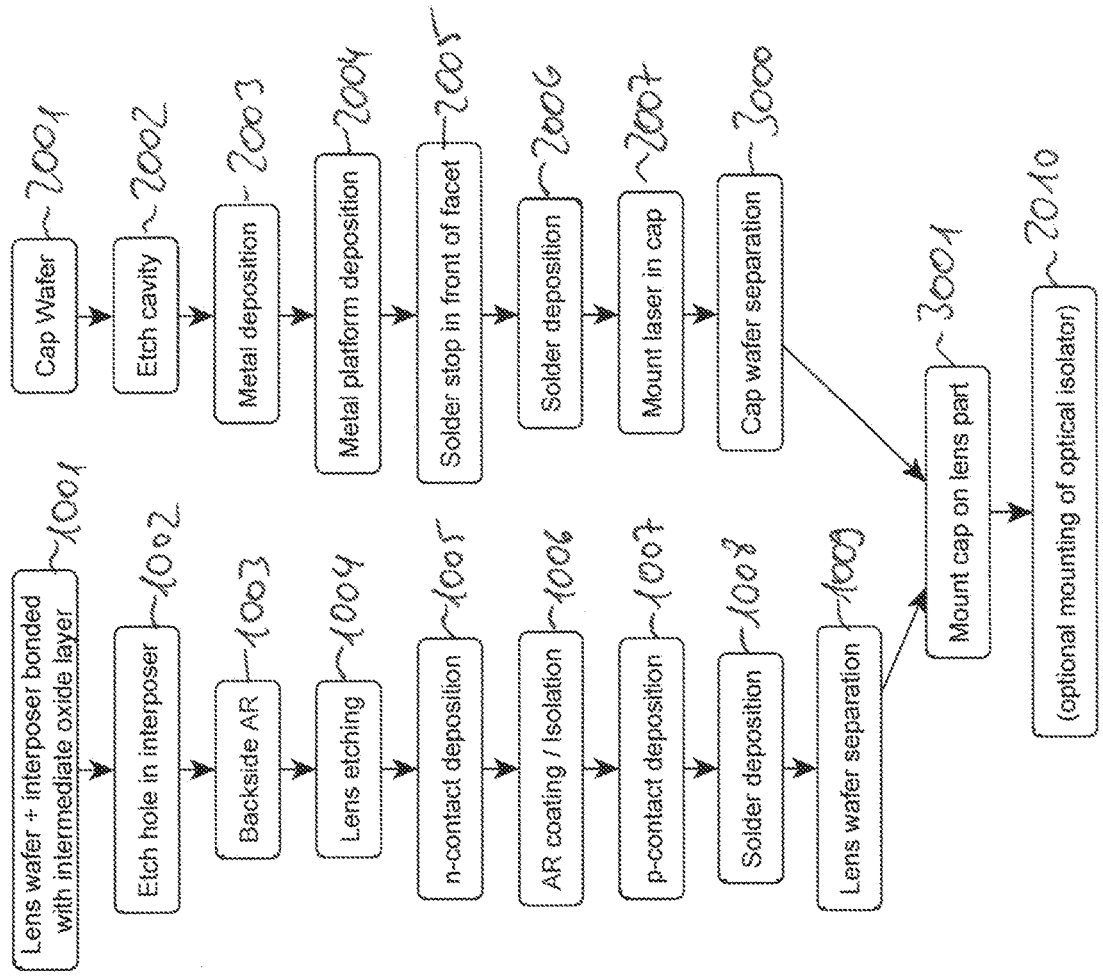

FIG. 14 shows another exemplary embodiment of a process flow that allows fabricating parts of the optical assembly 10. The method according to FIG. 14 refers to a chip scale process where an intermediate wafer (also referred to as lens wafer) and an interposer wafer are bonded before etching holes 90. The method according to FIG. 14 comprises the steps of:

bonding an intermediate wafer (for the future intermediate chips 50) and an interposer wafer (for the future interposer chips 60) by an intermediate oxide layer 120 (step 1001), etching holes 90 into the intermediate wafer (step 1002), providing an antireflection coating on the backside of the intermediate wafer (step 1003), etching lenses 51 on the outside surface of the intermediate wafer (step 1004), depositing the second conductive layer 502 (for the n-contacts of the optical emitters 20) on the outside surface of the intermediate wafer (step 1005), depositing the isolation layer 503 on top of the second conductive layer 502 (step 1006), depositing the first conductive layer 501 (for the p-contacts of the optical emitters 20) on top of the isolation layer 503 (step 1007), depositing solder 150 on top of the first conductive layer 501 (step 1008), separating the intermediate wafer to form separate base units (step 1009), masking a cap wafer (step 2001), etching recesses 70 into the cap wafer (step 2002), depositing a conductive layer 31 (step 2003), providing platforms for the optical emitters 20 (step 2004), depositing solder-stops adjacent to mirror sections 80 (step 2005), depositing solder 150 (step 2006), mounting optical emitters 20 (e.g. a lasers) in the recesses 70 and forming cap units 30 that carry the optical emitters 20 (step 2007), separating the resulting cap wafer in order to form separate cap units 30 (step 3000),
mounting the cap units 30 of step 3000 on the base units of step 1009 (step 3001),
optionally mounting rotators 110 (step 2010).

Figure 15:
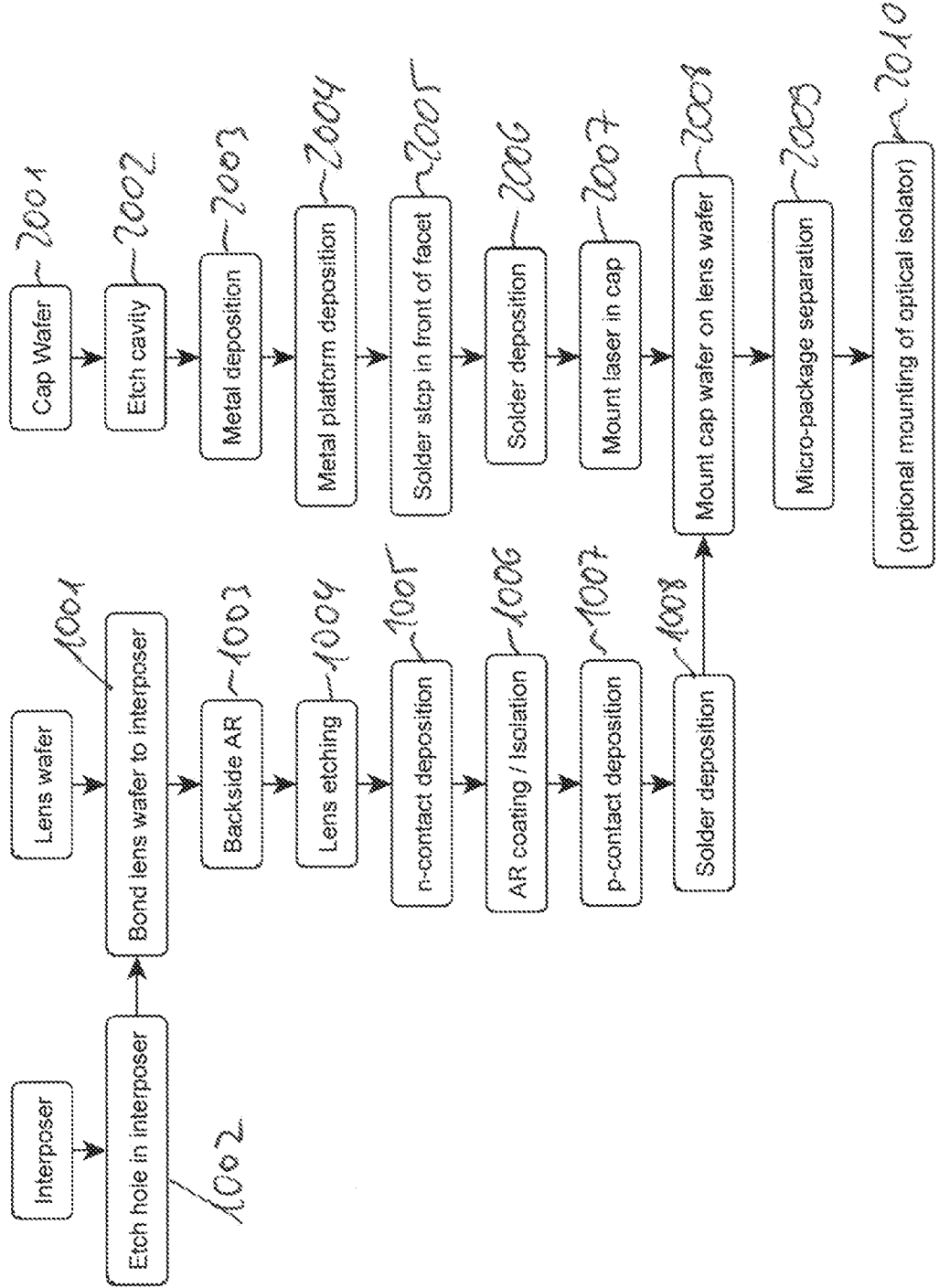

FIG. 15 shows another exemplary embodiment of a wafer scale process to fabricate parts of the optical assembly 10. The method according to FIG. 15 largely corresponds to the wafer scale process of FIG. 13. In contrast to FIG. 13, step 1002 is carried out before 1001. In other words, the intermediate wafer and the interposer wafer are bonded after etching the holes 90.

Figure 16:
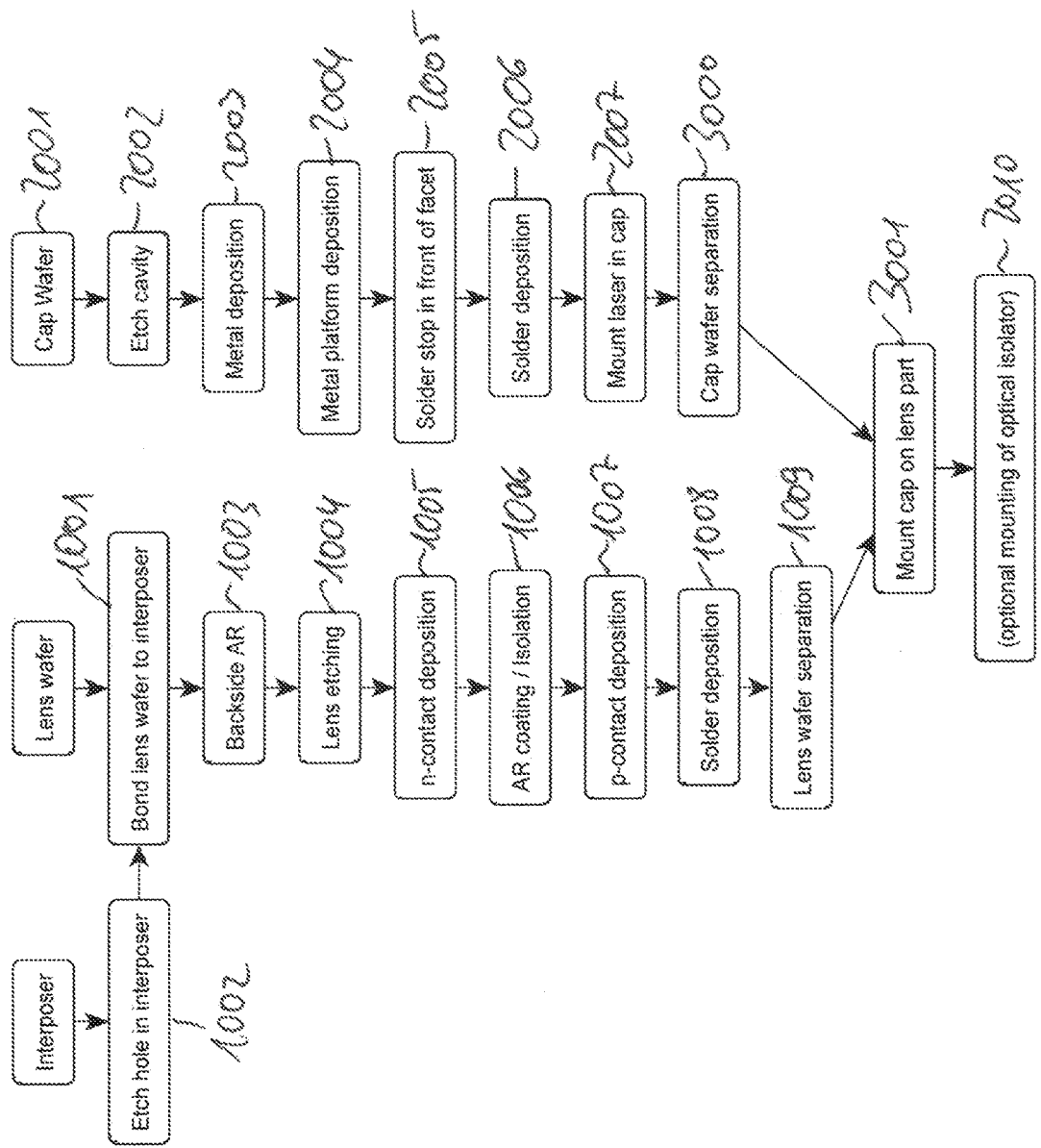

FIG. 16 shows another exemplary embodiment of a chip scale process to fabricate parts of the optical assembly 10. The method according to FIG. 16 largely corresponds to the chip scale process of FIG. 14. In contrast to FIG. 14, step 1002 is carried out before 1001. In other words, the intermediate wafer and the interposer wafer are bonded after etching the holes 90.

The wafer-scale fabrication as described above with reference to FIGS. 13 and 15 allows a cost-efficient mass production of optical assemblies according to the present invention.

Figure 17:
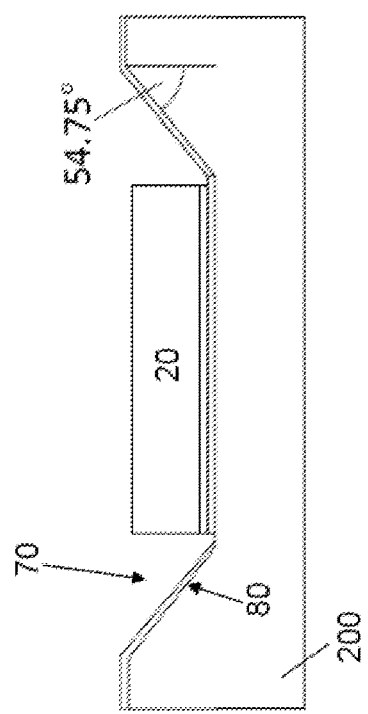

FIG. 17 shows an exemplary embodiment of a silicon cap wafer 200 consisting of (110)-Material. The recess 70 is etched anisotropically without etch-stop layer. The mirror section 80 is formed by a (111)-plane.

Figure 18:
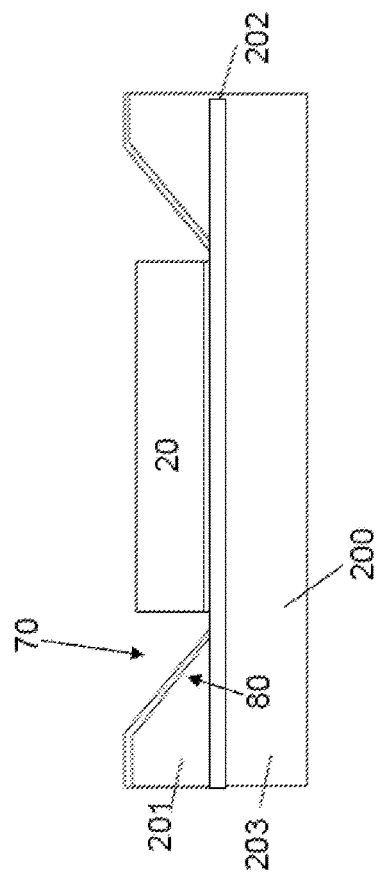

FIG. 18 shows an exemplary embodiment of a silicon cap wafer 200 consisting of SOI-material having a silicon top layer 201, an oxide layer 202, and a bottom layer 203. At least the silicon top layer 201 consists of (110)-Material. The recess 70 is etched anisotropically. The oxide layer 202 serves as an etch-stop layer. Again, the mirror section 80 is formed by a (111)-plane.

Figure 20:
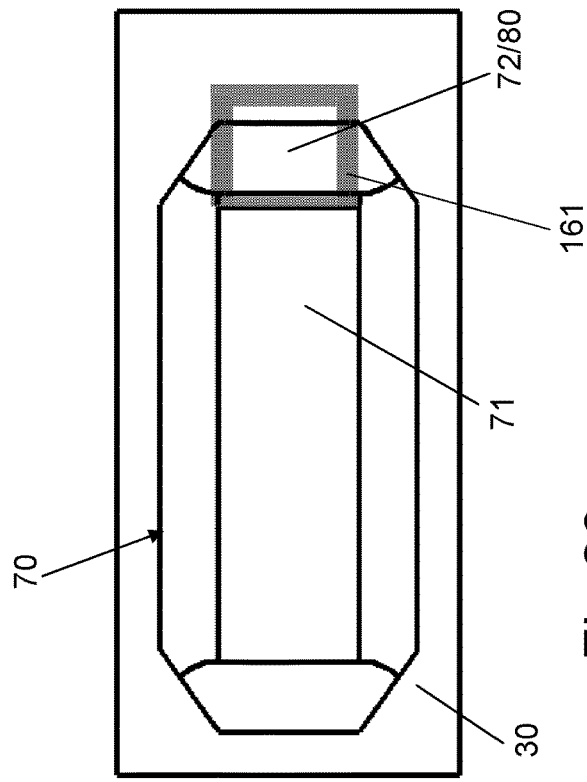
Figure 19:
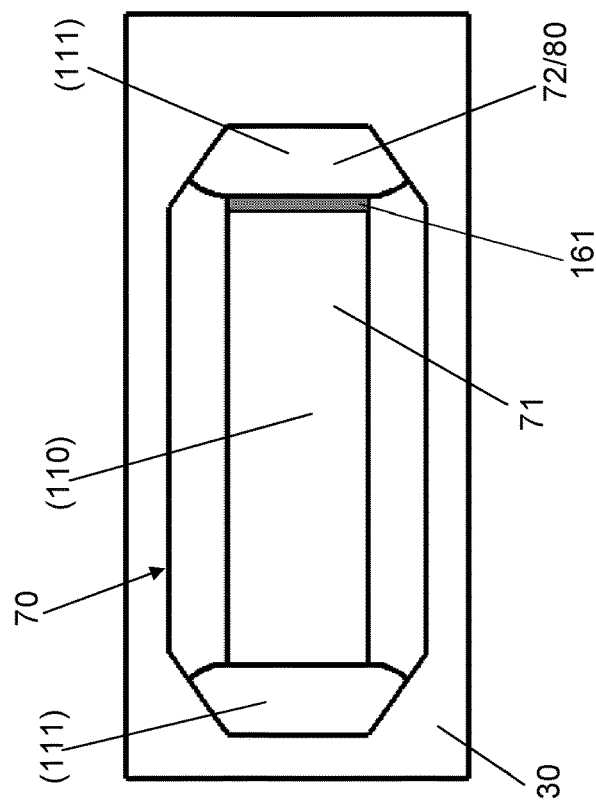

FIGS. 19 and 20 show a recess 70 after applying a solder-stop 161. In FIG. 19, the solder-stop 161 is arranged between the bottom of the recess 70 and the mirror section 80. In FIG. 20, the solder-stop 161 surrounds the mirror section 80.

Figure 21:
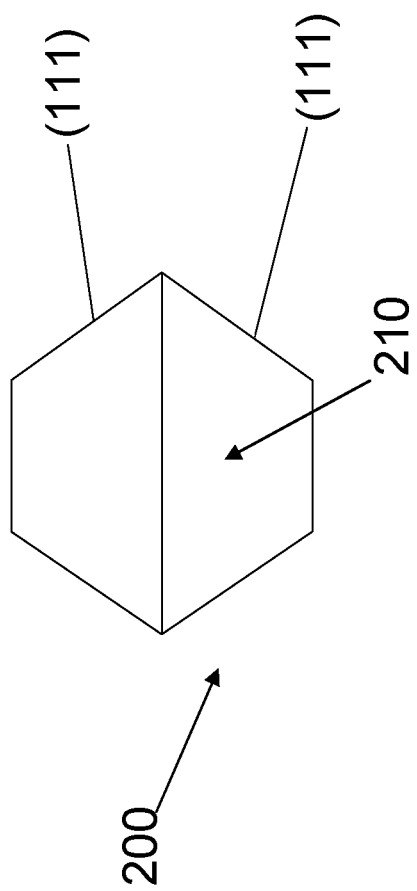

FIG. 21 shows an exemplary embodiment of a marker 210 that is etched in the (110)-surface of the silicon cap wafer 200. The marker 210 is delimited by (111)-oriented surfaces. The marker 210 facilitates the mounting of the cap unit 30 with respect to the interposer chip 60. The marker 210 is preferably located adjacent to the recess 70.

Figure 22:
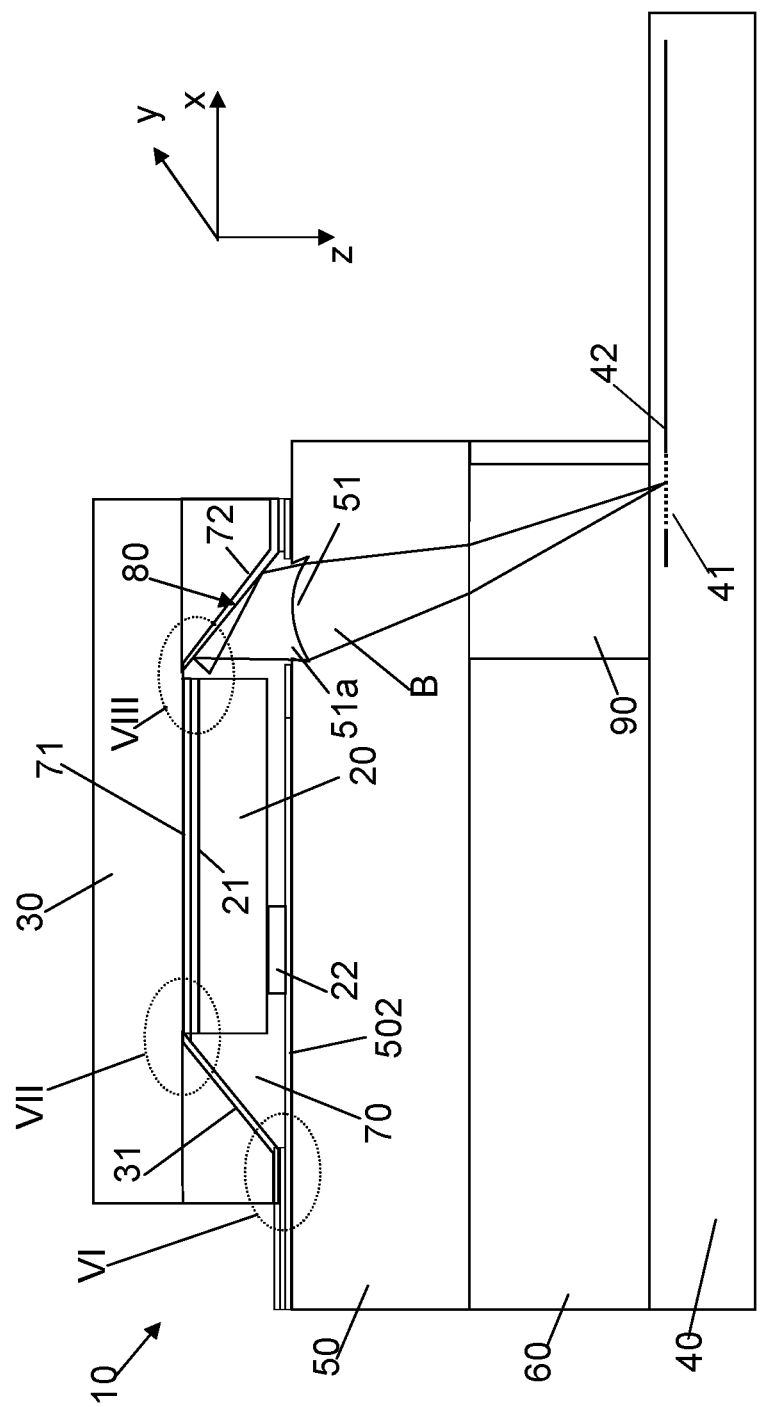

FIG. 22 shows a further exemplary embodiment of an optical assembly 10 according to the present invention. In this embodiment, the entire lens 51 is embedded in a recess 51a in the outer surface of the intermediate chip 50. The lens 51 is formed by the bottom of the recess 51a and located below the plane of the second conductive layer 502.

An advantage of the exemplary embodiments of optical assemblies as described above with reference to FIGS. 1-22 is that the vertical sandwich structure thermally separates the optical emitter 20 from the photonic chip 40. Therefore, the thermal impact of the optical emitter 20 on the photonic chip 40 is very small. The thermal impact may be further reduced by means of the heat spreader 180 as explained with reference to FIG. 12.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the world "or" and vice versa, and any combination thereof.

In the drawings and specification, there have been disclosed a plurality of embodiments of the present invention. The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one ore more) of the present dependent claims (regardless of the present claim structure). Therefore, the applicant may direct further patent claims towards other claim combinations at a later stage of the prosecution.

REFERENCE SIGNS 10 optical assembly
20 optical emitter
21 first electrical contact
22 second electrical contact
30 cap unit
31 conductive layer
31a sublayer
31b sublayer
40 photonic chip
41 coupler
42 waveguide
50 intermediate chip
51 lens
51a recess
60 interposer chip
70 recess
71 bottom section
72 sidewall
80 mirror section
90 hole
110 rotator
110a micro-package
110b external magnet
111 λ/2 waveplate
112 polarizer
120 intermediate oxide layer
150 solder
160 gap
161 solder-stop
180 heat spreader
200 silicon cap wafer
201 silicon top layer
202 oxide layer
203 bottom layer
210 marker
501 first conductive layer
502 second conductive layer
503 isolation layer
504 substrate
A1 first axis
A2 second axis
R1 radius
R2 radius
B beam of optical radiation
x space coordinate y space coordinate
z space coordinate

The invention claimed is:
1. Optical assembly comprising
an optical emitter configured to generate a beam of optical radiation,
a cap unit holding the optical emitter,
a photonic chip comprising a coupler, and
an intermediate chip arranged between the cap unit and the photonic chip,
wherein the cap unit comprises a recess having a bottom section and a sidewall,
wherein the optical emitter is mounted on the bottom section of the recess,
wherein a section of the sidewall forms a mirror section angled with respect to the bottom section and configured to reflect said beam of optical radiation towards the coupler, and
wherein the intermediate chip comprises a lens formed at a lens section of the intermediate chip's surface that faces the cap unit, said lens being configured to focus the reflected optical beam towards the coupler.

2. Optical assembly of claim 1
wherein the lens comprises a first axis and a second axis that is perpendicular to the first axis, and
wherein the radius of the curvature of the lens along the first axis differs from the radius of the curvature along the second axis.

3. Optical assembly of claim 2 wherein
the emission direction of the optical emitter corresponds to the direction of the first axis, and
the radius of the curvature along the first axis is between 2% and 15% larger than the radius along the second axis.

4. Optical assembly of claim 1 further comprising
an interposer chip that is arranged between the intermediate chip and the photonic chip,
wherein the interposer chip has a front surface that faces the intermediate chip and a backside surface that faces the photonic chip, and
wherein the backside surface comprises a hole that is located in the beam path between the lens and the coupler.

5. Optical assembly of claim 4
wherein the hole is a through-hole that extends from the front surface to the backside surface of the interposer chip.

6. Optical assembly of claim 4 wherein
a rotator is arranged within said hole.

7. Optical assembly of claim 4 wherein
a rotator and a $\lambda/2$-waveplate—with respect to the wavelength of the optical radiation—are arranged within said hole.

8. Optical assembly of claim 4 wherein
a polarizer, a rotator and a $\lambda/2$-waveplate—with respect to the wavelength of the optical radiation—are arranged within said hole.

9. Optical assembly of claim 4
wherein the interposer chip and the intermediate chip are bonded together by a buried oxide layer and
wherein the hole extends from the backside surface of the interposer chip through the interposer chip and through the buried oxide layer to the intermediate chip.

10. Optical assembly of claim 9
wherein the interposer chip, the intermediate chip and the buried oxide layer are formed by an SOI-chip.

11. Optical assembly of claim 1
wherein the cap unit comprises an SOI-chip having a silicon top layer, a buried oxide layer, and a bottom layer,
wherein the recess extends from the outer surface of the silicon top layer to the buried oxide layer or through the buried oxide layer to the bottom layer, and
wherein the bottom of the recess is formed by a section of the buried oxide layer or a section of the bottom layer.

12. Optical assembly of claim 1
wherein the cap unit comprises a semiconductor substrate having a front side in which the recess is formed, and
wherein said surface of the intermediate chip, in which said lens is formed, comprises at least one bonding section on which the front side of the cap unit is bonded.

13. Optical assembly of claim 12
wherein the semiconductor substrate is a (110)-oriented substrate with the front side being formed by a (110) surface and
wherein the mirror section is a (111) surface.

14. Optical assembly of claim 1
wherein a first electrical contact of the optical emitter is connected to a conductive layer of the cap unit, the conductive layer of the cap unit extending from the bottom section of the recess to a first bonding section of the cap unit, the first bonding section of the cap unit being located outside the recess and bonded to a first bonding section of the intermediate chip, and
wherein a second electrical contact of the optical emitter is directly bonded on a second bonding section of the intermediate chip.

15. Optical assembly of claim 14
wherein the conductive layer of the cap unit is thicker in the contact area where the optical emitter is located than outside this contact area.

16. Optical assembly of claim 14
wherein the conductive layer of the cap unit consists of two or more sublayers in the contact area and/or a conductive pad is located between the optical emitter and the conductive layer.

17. Optical assembly of claim 14
wherein the conductive layer forms a reflection coating on the mirror section.

18. Optical assembly of claim 14
wherein the conductive layer forms an electrical connection section between the bottom section of the recess and the first bonding section of the cap unit.

19. Optical assembly of claim 1
wherein the intermediate chip comprises a first conductive layer, a second conductive layer and an isolation layer and
wherein the isolation layer is arranged between the first and second conductive layer and insulates the first and second conductive layer from one another.

20. Optical assembly of claim 19
wherein the isolation layer of the intermediate chip forms an antireflection layer for the lens.

21. Optical assembly of claim 1
wherein a heat spreader is mounted on a backside of the cap unit, the backside being opposed to the front side where the recess is formed.

22. Method of fabricating an optical assembly comprising the steps of
fabricating a cap unit and mounting an optical emitter thereon, the optical emitter being configured to generate a beam of optical radiation, wherein said step of forming the cap unit comprises etching a recess having a bottom section and a sidewall, and mounting the optical emitter on the bottom section of the recess, forming a photonic chip comprising a coupler, forming an intermediate chip comprising a lens and arranging the intermediate chip between the cap unit and the photonic chip, wherein a section of the sidewall forms a mirror section that is angled with respect to the bottom section and configured to reflect said beam of optical radiation towards the coupler, and wherein the lens is formed at a lens section of the intermediate chip's surface that faces the cap unit, said lens being configured to focus the reflected optical beam towards the coupler.

23. Method of claim 22
wherein said step of fabricating the cap unit further comprises depositing a conductive layer,
wherein the conductive layer extends from the bottom section of the recess to a first bonding section of the cap unit located outside of the recess and forms an electric connection section, and
wherein the conductive layer further forms a reflection coating on the mirror section.

24. Method of claim 22
wherein the thickness of the conductive layer is made thicker in the contact area where the optical emitter is located than outside this contact area.

25. Method of claim 22
wherein said step of fabricating the cap unit further comprises depositing solder on the bottom section of the recess before mounting the optical emitter on the bottom section of the recess.

26. Method of claim 22
wherein said step of fabricating the cap unit further comprises providing a solder stop between the bottom section of the recess and the mirror section.

27. Method of claim 22
wherein said step of fabricating the cap unit further comprises providing a solder stop that completely surrounds the mirror section.

28. Method of claim 22
wherein the recess is deeper than the thickness of the optical emitter.

29. Method of claim 22
wherein the cap unit comprises an SOI-Chip having a (110)-silicon top layer, a buried oxide layer, and a bottom layer,
wherein the recess is anisotropically etched from the outer surface of the silicon top layer to the buried oxide layer or through the buried oxide layer to the bottom layer,
wherein the bottom of the recess is formed by a section of the buried oxide layer or a section of the bottom layer, and
wherein the mirror section is provided by a (111)-surface of the etched recess.

30. Method of claim 22
wherein forming the intermediate chip comprises etching the lens at one side of the intermediate chip.

31. Method of claim 22
wherein forming the intermediate chip comprises depositing an antireflection coating on the other side of the intermediate chip.

32. Method of claim 30
wherein forming the intermediate chip comprises depositing an antireflection coating on the lens.

33. Method of claim 22
wherein said step of fabricating the intermediate chip comprises depositing a first conductive layer, an isolation layer and a second conductive layer wherein the isolation layer is arranged between the first and second conductive layer and insulates the first and second conductive layer from one another.

34. Method of claim 33
wherein the isolation layer of the intermediate chip forms an antireflection layer on the lens.

35. Method of claim 22
wherein the sidewall of the recess or at least the mirror section are etched using KOH or TMAH.

36. Method of claim 22 further comprising the step of fabricating an interposer chip and arranging the interposer chip between the intermediate chip and the photonic chip.

37. Method of claim 36 further comprising the steps of etching a hole in the backside surface of the interposer chip and
positioning the hole in the beam path between the lens and the coupler.

38. Method of claim 37
wherein said step of etching the hole comprises etching a through-hole extending from the front surface to the backside surface of the interposer chip.

39. Method of claim 22
wherein said step of etching the recess includes etching alignment marks that facilitate mounting the silicon cap in a predefined position onto the intermediate chip.

40. Optical assembly of claim 37
wherein the interposer chip comprises SOI material having a silicon substrate, a buried oxide layer and a top silicon layer and
wherein said step of etching the hole comprises etching a blind hole extending from the backside surface to the buried oxide layer.

41. Method of claim 22 further comprising the steps of etching a hole in an interposer chip, and
bonding the interposer chip and the intermediate chip.

42. Method of claim 41 wherein
the lens is formed in the intermediate chip after bonding the interposer chip and intermediate chip.

43. Method of claim 22 further comprising the steps of bonding an interposer chip and the intermediate chip via an intermediate oxide layer and forming a sandwich,
etching a through-hole in the interposer chip using the intermediate oxide layer as an etch-stop-layer, and
removing the etch-stop-layer in the hole and forming a pot-hole, the bottom of which is formed by the intermediate chip.

* * * * *